(12) United States Patent
Nakagawa et al.

(10) Patent No.: US 7,071,512 B2
(45) Date of Patent: Jul. 4, 2006

(54) NON-VOLATILE SEMICONDUCTOR MEMORY DEVICE

(75) Inventors: Kenichiro Nakagawa, Kanagawa (JP); Tomohiro Hamajima, Kanagawa (JP); Koichi Ando, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 11/070,150

(22) Filed: Mar. 3, 2005

(65) Prior Publication Data

US 2005/0230743 A1    Oct. 20, 2005

(30) Foreign Application Priority Data

Mar. 4, 2004   (JP)   ............... 2004/060572

(51) Int. Cl.
*H01L 29/792*    (2006.01)
(52) U.S. Cl. .............. 257/324; 257/314; 257/315; 257/316; 257/320; 257/321; 257/325
(58) Field of Classification Search ............... None
See application file for complete search history.

(56) References Cited

U.S. PATENT DOCUMENTS 5,596,214 A * 1/1997 Endo .................. 257/324
6,005,270 A * 12/1999 Noguchi ............. 257/315
6,342,716 B1 * 1/2002 Morita et al. ........ 257/315

FOREIGN PATENT DOCUMENTS

JP      7-326681      12/1995

OTHER PUBLICATIONS

T. Ogura, et al., "Embedded Twin MONOS Flash Memories with 4ns and 15ns Fast Access Times," 2003 Symposium on VLSI Circuits, Digest of Technical Papers.
H. Iwai, "Subject Toward Practical Application of High-k Gate Insulating Film," 57th VLSI Forum, VLSI Report, Feb. 23, 2001, pp. 13-28.

* cited by examiner

*Primary Examiner*—Andy Huynh
(74) *Attorney, Agent, or Firm*—McGinn IP Law Group, PLLC

(57) ABSTRACT

A non-volatile semiconductor memory device includes a substrate, a first insulating film formed on the substrate, a second insulating film formed on the first insulating film, a plurality of granular dots formed in the second insulating film adjacent to the first insulating film as a floating gate, and a control gate formed on the second insulating film. The second insulating film is a high dielectric constant film made of oxide whose dielectric constant is higher than that of the first insulating film and whose heat of formation is higher than that of silicon oxide.

12 Claims, 20 Drawing Sheets

Fig. 4

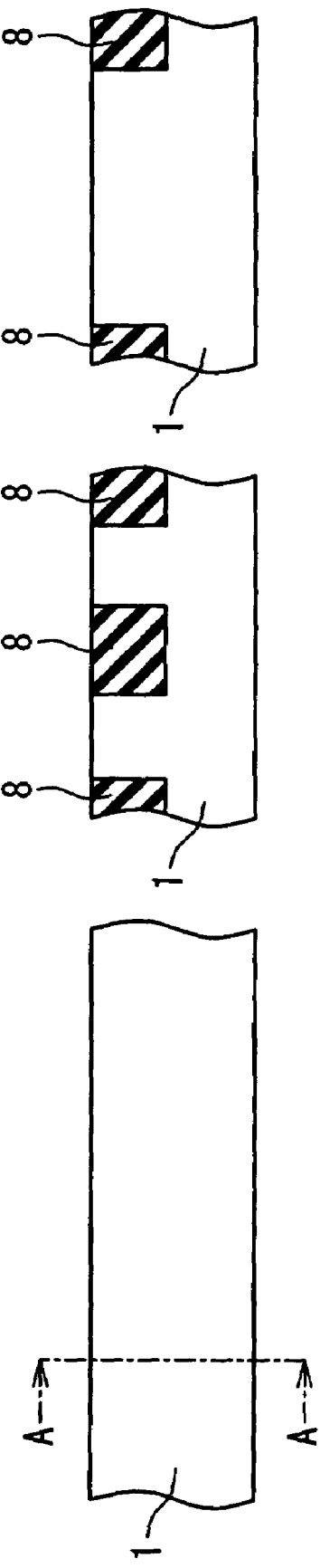

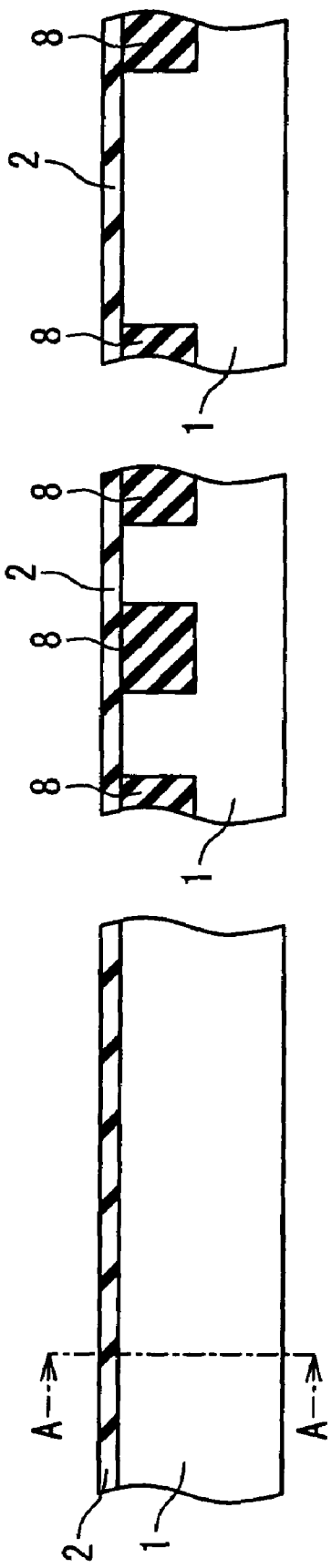

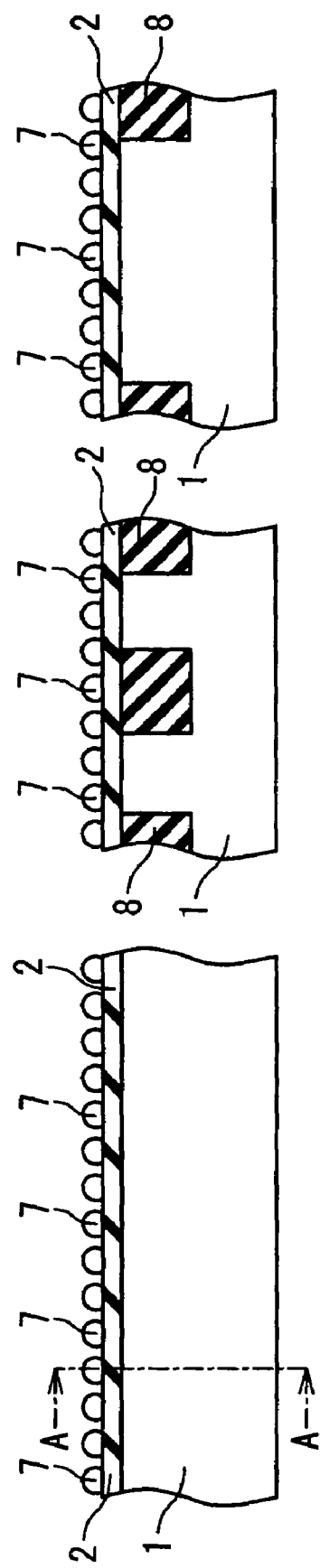

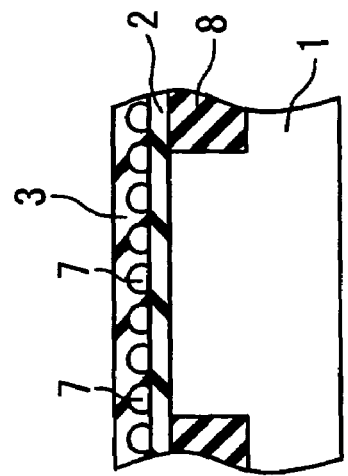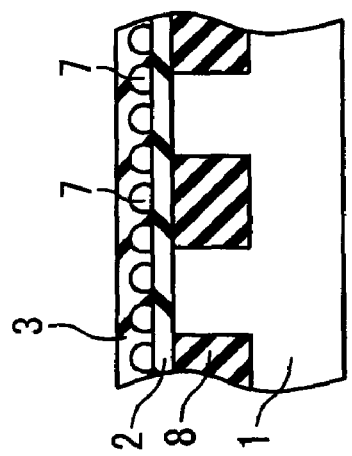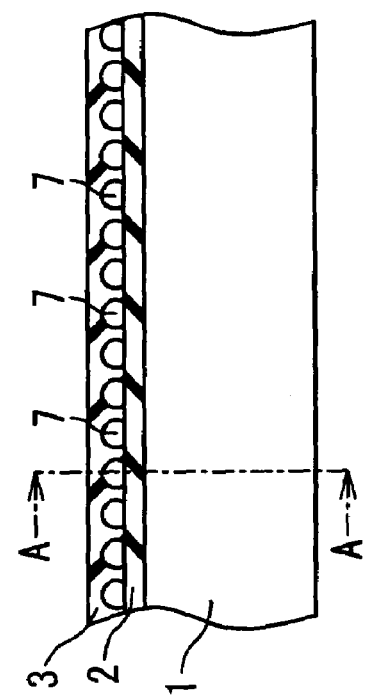

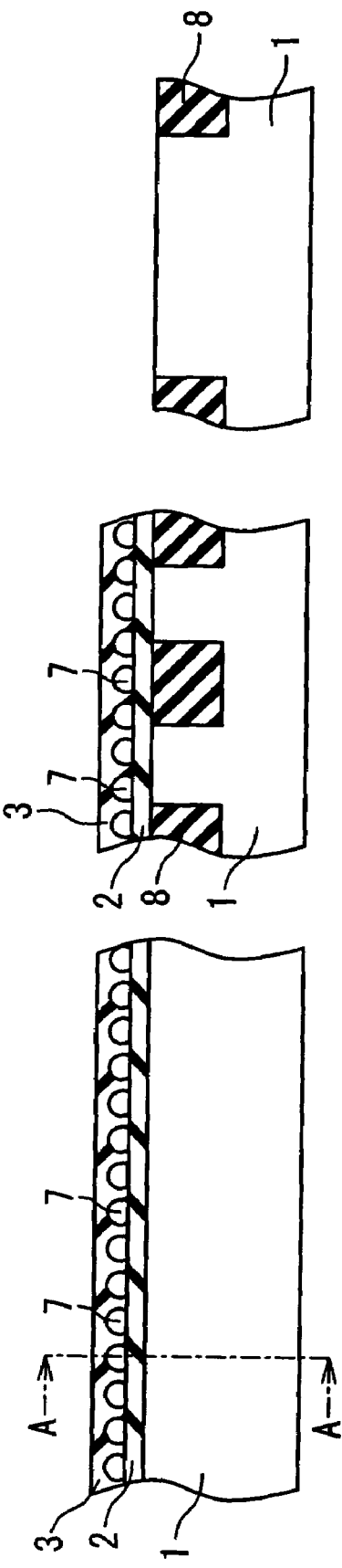

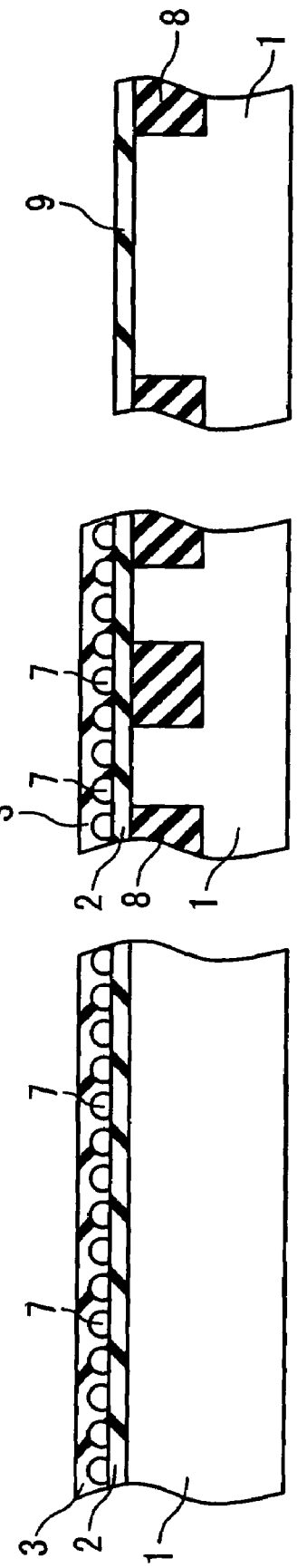

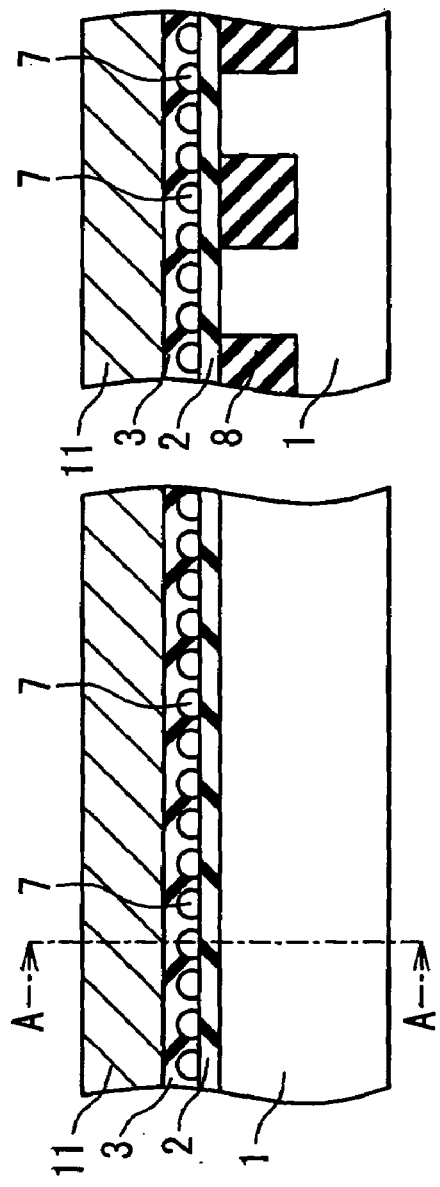

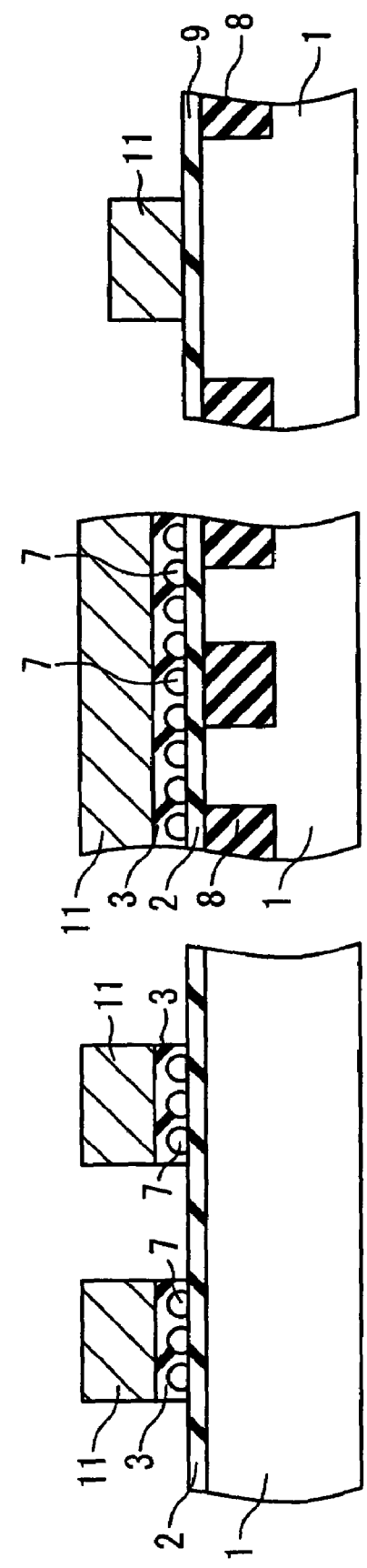

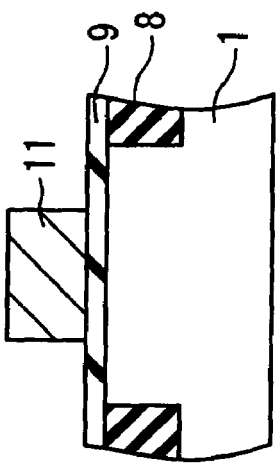

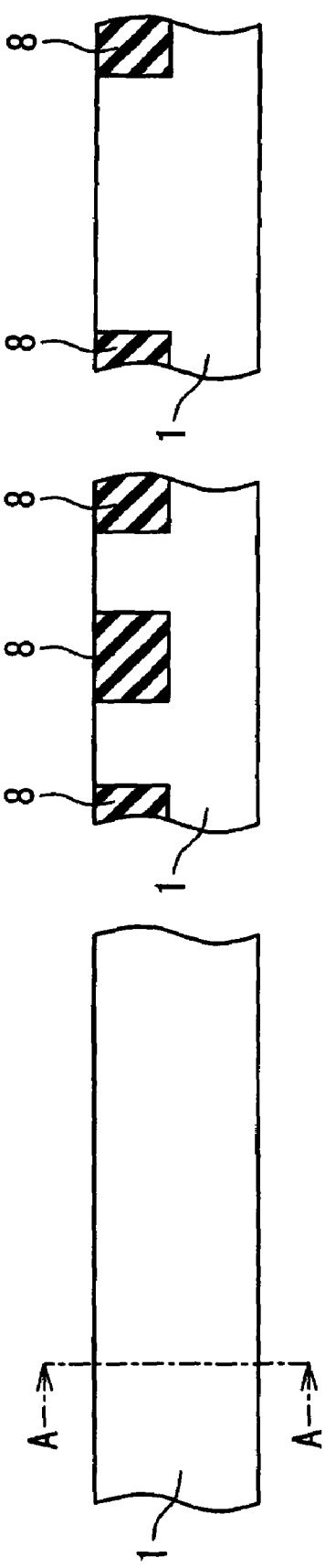

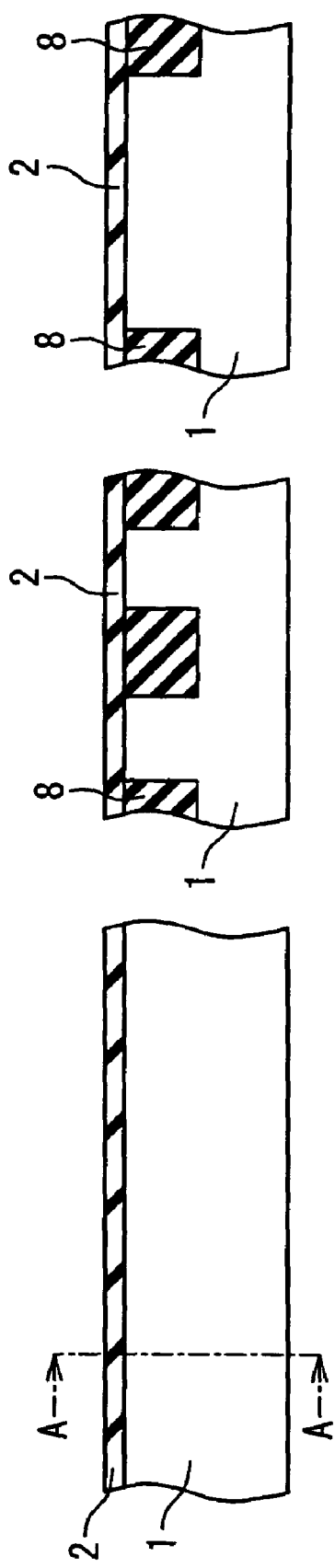

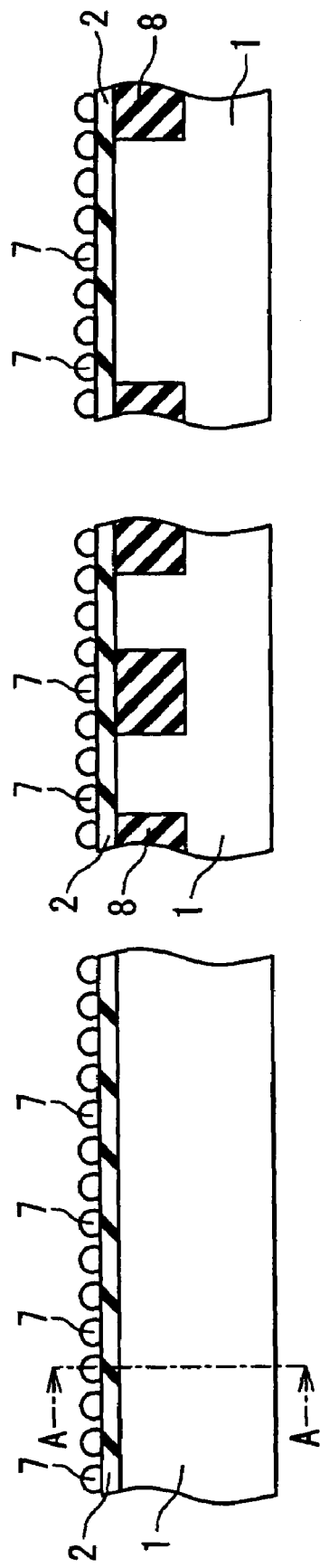

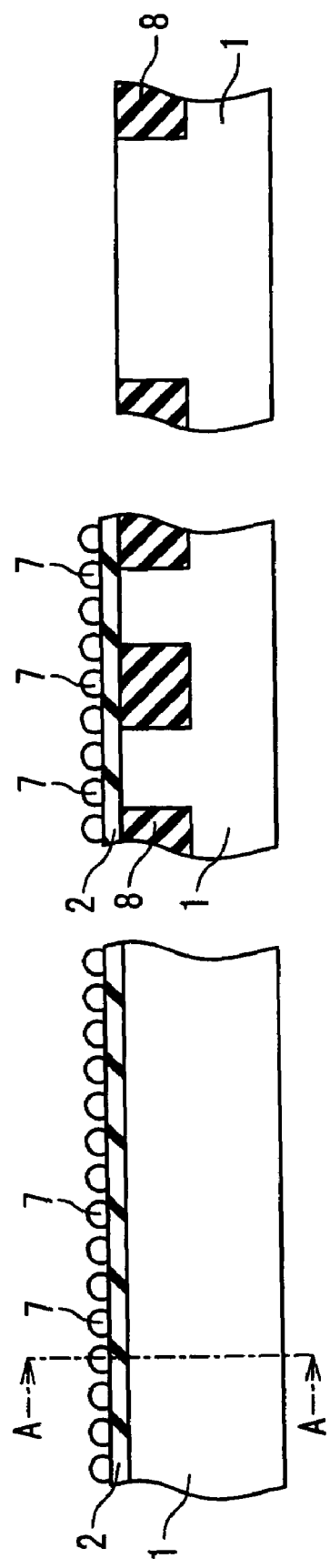

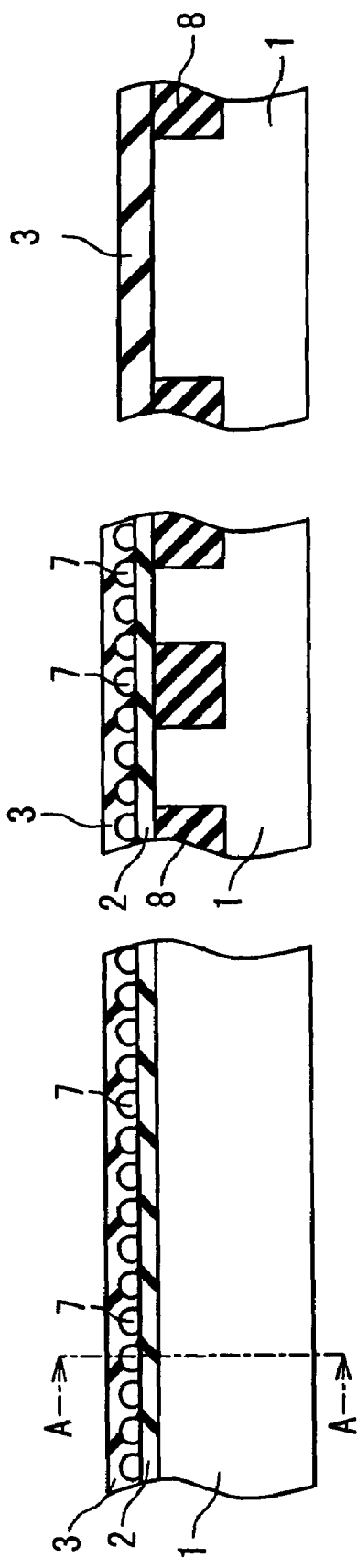

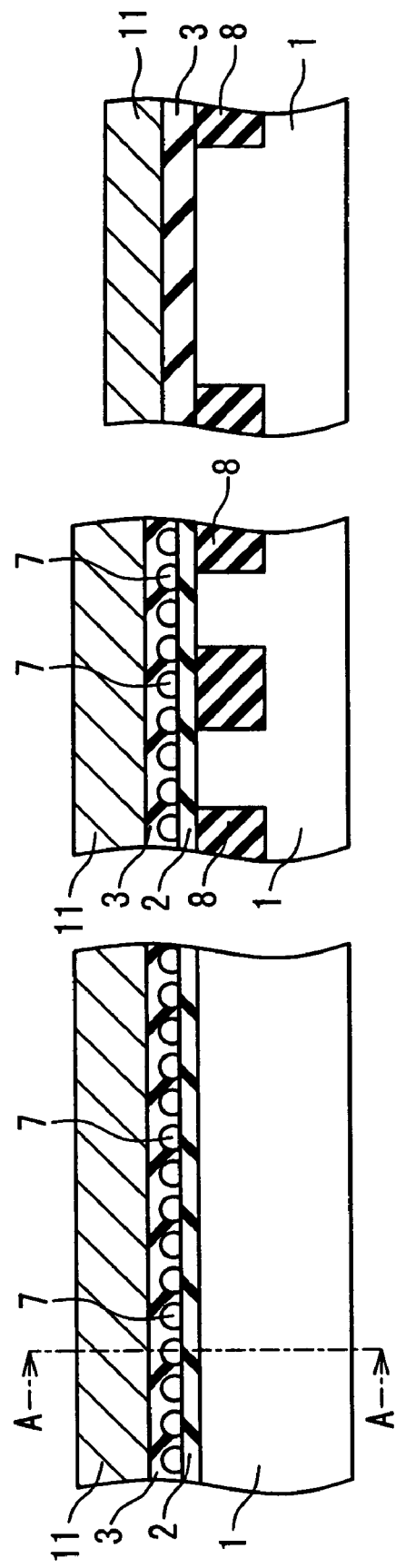

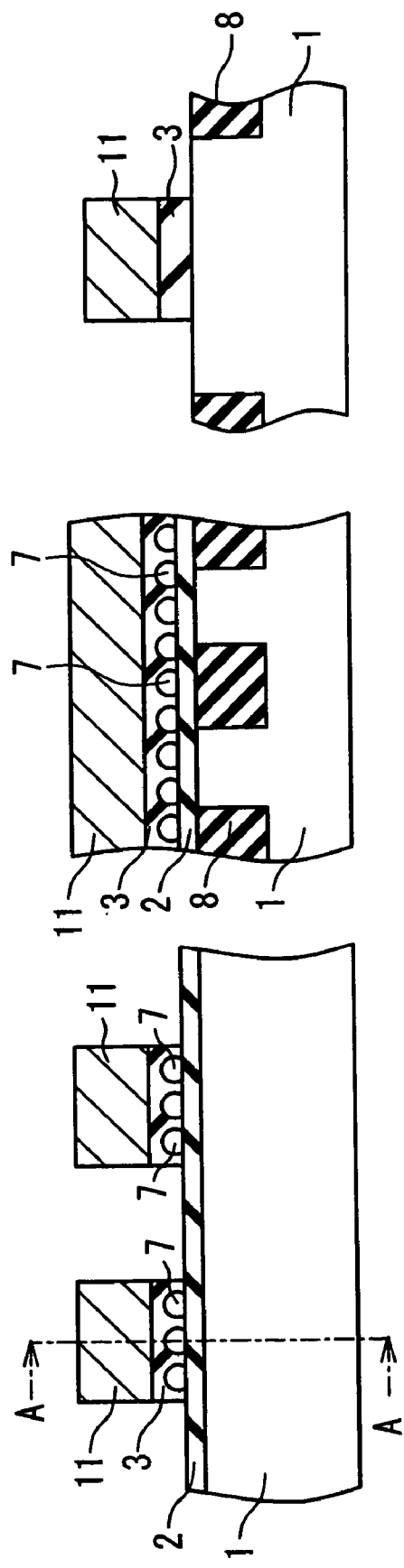

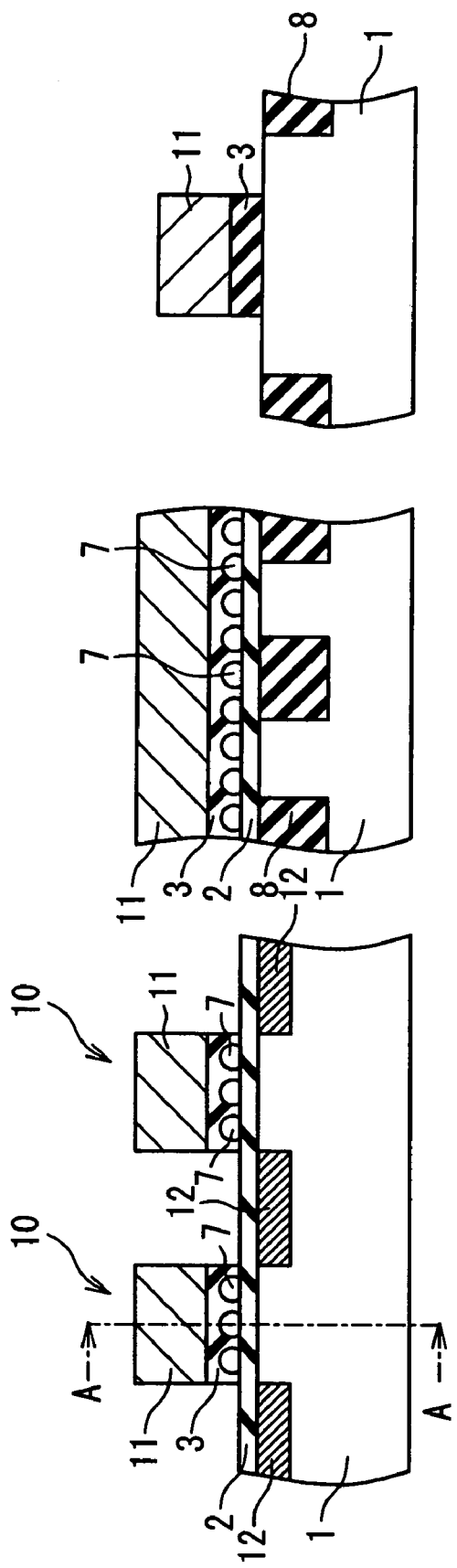

NON-VOLATILE SEMICONDUCTOR MEMORY DEVICE

BACKGROUND OF THE INVENTION

1. Field of the Invention

The present invention relates to a non-volatile semiconductor memory device in which programming and erasing are possible electrically. More particularly, the present invention relates to a non-volatile semiconductor memory device in which a memory cell has a floating gate structure, and a semiconductor device including the non-volatile semiconductor memory device.

2. Description of the Related Art

Conventionally, in a non-volatile semiconductor memory device such as a flash memory and the like, a floating gate made of poly-silicon and the like is formed on a gate oxide film of an n-type MOS transistor. An insulating film such as an ONO (Oxide-Nitride-Oxide) film and the like is formed on the floating gate. A control gate is formed on the insulating film. Each memory cell has such a structure, and a plurality of memory cells are arranged in matrix form. According to the non-volatile semiconductor memory device having such a configuration, the floating gate as a charge accumulation layer is electrically insulated from the other portions, and data is stored by injecting electrons into the floating gate of a memory cell.

High performance, low voltage, and low power are major issues for a flash memory. A technology for achieving a flash memory with fast access times is described, for example, in T. Ogura et al., "Embedded Twin MONOS Flash Memories with 4 ns and 15 ns Fast Access Times", 2003 Symposium on VLSI Circuits Digest of Technical Papers.

Recently, in order to reduce the operation voltage and the power consumption of a transistor, it is considered to form a gate insulating film by using high dielectric constant materials. Such a high dielectric constant film (a high-k film) is described, for example, in H. Iwai, "Subject toward practical application of high-k gate insulating film", 57-th VLSI FORUM, VLSI Report, Feb. 23, 2001, pp. 13–28. For the same reason, it is also proposed in the field of the non-volatile semiconductor memory device to form a charge accumulation layer by using high dielectric constant materials such as strontium titanate, BST (barium strontium titanate) and so on, as disclosed in Japanese Laid Open Patent Application (JP-A-Heisei 7-326681) which will be referred to as a patent document.

FIG. 1 is a cross-sectional view showing a memory cell of a non-volatile semiconductor memory device disclosed in the patent document. As shown in FIG. 1, a memory cell 100 of the non-volatile semiconductor memory device is configured as follows. A source 105 and a drain 106 are formed in a silicon substrate 101. A channel region is formed between the source 105 and the drain 106. A first insulating film 102 is formed on the channel region, which is a silicon oxide film having a thickness of 2.5 to 5.0 nm. A second insulating film 103 which serves as the charge accumulation layer is formed on the first insulating film 102. The second insulating film 103 has a thickness of 50 to 100 nm, and is made of strontium titanate, barium strontium titanate, and barium titanate and the like. The second insulating film 103 is a high dielectric constant film. A control gate 104 made of doped poly-silicon (for example, phosphor doped poly-silicon) is formed on the high dielectric constant film 103.

Also, a non-volatile semiconductor memory device is proposed in the patent document, in which a silicon grain (hereinafter, referred to as a Si grain) whose grain diameter is not larger than 10 Å is used as a floating gate. FIG. 2 is a cross-sectional view showing a memory cell of the non-volatile semiconductor memory device which uses Si grains. As shown in FIG. 2, a memory cell 110 of the non-volatile semiconductor memory device is configured as follows. A source 105 and a drain 106 are formed in a silicon substrate 101. A channel region is formed between the source 105 and the drain 106. A first insulating film 102 is formed on the channel region, which is a silicon oxide film having a thickness of 2.5 to 3.0 nm. A large number of Si grains 107 are formed on the first insulating film 102 as a floating gate. Each Si grain 107 is made of micro powder of silicon crystal or silicon cluster whose grain diameter is equal to or less than 1 nm. A second insulating film 103 is formed to cover the first insulating film 102 and the Si grains 107. The second insulating film 103 has a thickness of about 50 nm, and is made of strontium titanate, barium strontium titanate, and barium titanate and the like. A control gate 104 made of doped poly-silicon is formed on the second insulating film 103.

When programming of the memory cell is performed, for example, the source 105 and the substrate 101 are grounded, and a high voltage is applied to the control gate 104 and the drain 106. Accordingly, electrons move in the channel region at a high speed from the source 105 to the drain 106. Then, the electrons acquiring a high energy in the vicinity of the drain 106 pass through the silicon oxide film 102 and are injected into the Si grains 107 which is the floating gate. As a result, the floating gate is negatively charged, and hence a threshold voltage observed from the control gate 104 becomes high.

On the other hand, when erasing of the memory cell is performed, the source 105 is opened, and the control gate 104 and the substrate 101 are grounded. Then, when a high voltage is applied to the drain 106, the electrons stored in the Si grains 107 are pulled out to the drain 106, and thus the potential of the floating gate is returned to neutral. As a result, the threshold voltage observed from the control gate 104 is returned to the state prior to the programming.

According to the non-volatile semiconductor memory device having the cell structure as shown in FIG. 2, the charge accumulation layer is made of the high dielectric constant material, which increases a capacity between the Si grains 107 and the control gate 104. It is therefore possible not only to reduce the voltages at the times of the programming and erasing but also to greatly reduce the programming and erasing times.

However, the conventional techniques mentioned above have the following problems. In the non-volatile semiconductor memory device described in the above-mentioned patent document, such materials as tantalum pentoxide, strontium titanate, barium strontium titanate, lead-zirconate-titanate and the like are used for forming the second insulating film 103. When thermally treated at a high temperature, these materials react with silicon components included in the control gate 104 and the Si grains 107. Therefore, it is not possible to perform the thermal treatment at a high temperature after the formation of the second insulating film 103. For example, when the material of the second insulating film 103 reacts with the silicon in the control gate 104, not only a silicon oxide film is formed but also metal is generated, which causes the variation in properties and the leak current. Also, when the material of the high dielectric constant film 103 and the silicon in the Si grain 107 react with each other, a silicon oxide film (an $SiO_2$ film) is formed on the surface of the Si grain 107. In this case, a region for accumulating the charge is reduced. Also, the metal generated by the reaction causes the deterioration in the charge holding property. Therefore, it is necessary to carry out at a low temperature the thermal treatment which should be performed after the formation of the second insulating film 103 such as a thermal treatment for activating the source and drain and the like. In other words, the manufacturing processes are limited according to the non-volatile semiconductor memory device disclosed in the above-mentioned patent document.

As for the control gate 104, it is possible to prevent the control gate 104 from reacting with the silicon by forming a barrier film such as a silicon nitride film and the like between the control gate 104 and the high dielectric constant film 103. However, to provide the barrier film is not preferable in that the barrier film causes increase in the driving voltage.

SUMMARY OF THE INVENTION

It is therefore an object of the present invention to provide a non-volatile semiconductor memory device, in which the programming and the erasing can be carried out at a lower voltage than that of the conventional technique, and there is no limit of the manufacturing process.

In an aspect of the present invention, a non-volatile semiconductor memory device includes a substrate, a first insulating film formed on the substrate, a second insulating film formed on the first insulating film, a plurality of granular dots formed in the second insulating film adjacent to the first insulating film as a floating gate, and a control gate formed on the second insulating film. The second insulating film is a high dielectric constant film made of oxide whose dielectric constant is higher than that of the first insulating film and whose heat of formation is higher than that of silicon oxide.

According to the present invention, since the second insulating film is made of high dielectric constant material, it is possible to reduce the voltage applied to the control gate at the time of the programming and the erasing. Also, even when the first insulating film is made thicker in order to prevent the leakage of charges from the charge accumulation layer, it is possible to carry out the programming and the erasing with the voltage at the same level as the conventional level. Moreover, since the second insulating film (high dielectric constant film) is made of oxide whose heat of formation is higher than that of silicon oxide, the second insulating film is stable as compared with the silicon oxide. Therefore, even when the thermal treatment is carried out at a high temperature after the formation of the second insulating film, no reaction between the second insulating film and the silicon included in the control gate occurs.

Also, the plurality of granular dots formed in the second insulating film can be made of at least one material selected from the group consisting of silicon and germanium. As described above, the second insulating film is the high dielectric constant film made of oxide whose heat of formation is higher than that of silicon oxide. Therefore, even when the thermal treatment is carried out at a high temperature after the formation of the second insulating film, no reaction occurs between the second insulating film and silicon or germanium included in the plurality of granular dots. It should be noted that the granular dots distributed in the second insulating film serve as the floating gate. According to the non-volatile semiconductor memory device, data is stored by injecting and storing electrons in the granular dots.

Preferably, the second insulating film is made of oxide including at least one metal selected from the group consisting of Li, Be, Mg, Al, Ca, Sc, Sr, Y, Zr, La, Hf, Ce, Pr, Nd, Sm, Eu, Gd, Tb, Dy, Ho, Er, Tm, Tb and Lu. In particular, it is further preferable that the second insulating film is made of oxide selected from the group consisting of $Al_2O_3$, $CeO_2$, $HfO_2$, $La_2O_3$, MgO, $Sc_2O_3$ and $ZrO_2$. Each of these oxides has high dielectric constant, and its heat of formation is substantially higher than that of silicon oxide. It is therefore possible to reduce the applied voltage at the time of the programming and the erasing and to improve the stability with regard to the high temperature.

In another aspect of the present invention, a semiconductor device includes not only the non-volatile semiconductor memory device mentioned above but also an integrated circuit formed on the same substrate and used for a logic circuit. That is to say, the non-volatile semiconductor memory device can be combined with the logic integrated circuit on the substrate. The integrated circuit includes a transistor. In this case, at least a part of a gate insulating film of the transistor can be the above-mentioned high dielectric constant film. The high dielectric constant film as the second insulating film can be applied to the gate insulating film of the logic integrated circuit. Thus, the gate insulating film of the logic integrated circuit and the second insulating film can be formed simultaneously at the same process. It is therefore possible according to the present invention to simplify the manufacturing process.

According to the present invention, the second insulating film serving as a charge accumulation layer is formed by using a high dielectric constant film. The high dielectric constant film is made of oxide whose dielectric constant is higher than that of the first insulating film as a gate insulating film and whose heat of formation is higher than that of oxide silicon. Thus, it is possible to reduce the voltage applied to the control gate at the time of the programming and the erasing. Moreover, since the thermal stability of the second insulating film is improved, it is also possible to carry out thermal treatment at a high temperature.

BRIEF DESCRIPTION OF THE DRAWINGS

FIG. 4 is a view showing elements constituting an oxide which is stable for silicon;

FIG. 5A is a cross-sectional view showing a manufacturing method of a memory cell 10;

FIG. 5B is a cross-sectional view along a line A—A shown in FIG. 5A; FIG. 5C is a cross-sectional view of a peripheral circuit region;

FIG. 6A is a cross-sectional view showing the next step of the manufacturing method of the memory cell 10;

FIG. 6B is a cross-sectional view along a line A—A shown in FIG. 6A;

FIG. 6C is a cross-sectional view of the peripheral circuit region;

FIG. 7A is a cross-sectional view showing the next step of the manufacturing method of the memory cell 10;

FIG. 7B is a cross-sectional view along a line A—A shown in FIG. 7A;

FIG. 7C is a cross-sectional view of the peripheral circuit region;

FIG. 8A is a cross-sectional view showing the next step in the manufacturing method of the memory cell 10;

FIG. 8B is a cross-sectional view along a line A—A shown in FIG. 8A;

FIG. 8C is a cross-sectional view of the peripheral circuit region;

FIG. 9A is a cross-sectional view showing the next step of the manufacturing method of the memory cell 10;

FIG. 9B is a cross-sectional view along a line A—A shown in FIG. 9A;

FIG. 9C is a cross-sectional view of the peripheral circuit region;

FIG. 10A is a cross-sectional view showing the next step of the manufacturing method of the memory cell 10;

FIG. 10B is a cross-sectional view along a line A—A shown in FIG. 9A;

FIG. 10C is a cross-sectional view of the peripheral circuit region;

FIG. 11A is a cross-sectional view showing the next step of the manufacturing method of the memory cell 10;

FIG. 11B is a cross-sectional view along a line A—A shown in FIG. 11A;

FIG. 11C is a cross-sectional view of the peripheral circuit region;

FIG. 12A is a cross-sectional view showing the next step of the manufacturing method of the memory cell 10;

FIG. 12B is a cross-sectional view along a line A—A shown in FIG. 12A;

FIG. 12C is a cross-sectional view of the peripheral circuit region;

FIG. 13A is a cross-sectional view showing the next step of the manufacturing method of the memory cell 10;

FIG. 13B is a cross-sectional view along a line A—A shown in FIG. 13A;

FIG. 13C is a cross-sectional view of the peripheral circuit region;

FIG. 14A is a cross-sectional view showing another manufacturing method of the memory cell 10;

FIG. 14B is a cross-sectional view along a line A—A shown in FIG. 14A;

FIG. 14C is a cross-sectional view of a peripheral circuit region;

FIG. 15A is a cross-sectional view showing the next step of the other manufacturing method of the memory cell 10;

FIG. 15B is a cross-sectional view along a line A—A shown in FIG. 14A;

FIG. 15C is a cross-sectional view of the peripheral circuit region;

FIG. 16A is a cross-sectional view showing the next step of the other manufacturing method of the memory cell 10;

FIG. 16B is a cross-sectional view along a line A—A shown in FIG. 16A;

FIG. 16C is a cross-sectional view of the peripheral circuit region;

FIG. 17A is a cross-sectional view showing the next step of the other manufacturing method of the memory cell 10;

FIG. 17B is a cross-sectional view along a line A—A shown in FIG. 17A;

FIG. 17C is a cross-sectional view of the peripheral circuit region;

FIG. 18A is a cross-sectional view showing the next step of the other manufacturing method of the memory cell 10;

FIG. 18B is a cross-sectional view along a line A—A shown in FIG. 18A;

FIG. 18C is a cross-sectional view of the peripheral circuit region;

FIG. 19A is a cross-sectional view showing the next step of the other manufacturing method of the memory cell 10;

FIG. 19B is a cross-sectional view along a line A—A shown in FIG. 19A;

FIG. 19C is a cross-sectional view of the peripheral circuit region;

FIG. 20A is a cross-sectional view showing the next step of the other manufacturing method of the memory cell 10;

FIG. 20B is a cross-sectional view along a line A—A shown in FIG. 20A;

FIG. 20C is a cross-sectional view of the peripheral circuit region;

FIG. 21A is a cross-sectional view showing the next step of the other manufacturing method of the memory cell 10;

FIG. 21B is a cross-sectional view along a line A—A shown in FIG. 21A; and

FIG. 21C is a cross-sectional view of the peripheral circuit region.

DESCRIPTION OF THE PREFERRED EMBODIMENTS

Embodiments of the present invention will be described below with reference to the attached drawings.

Figure 3:
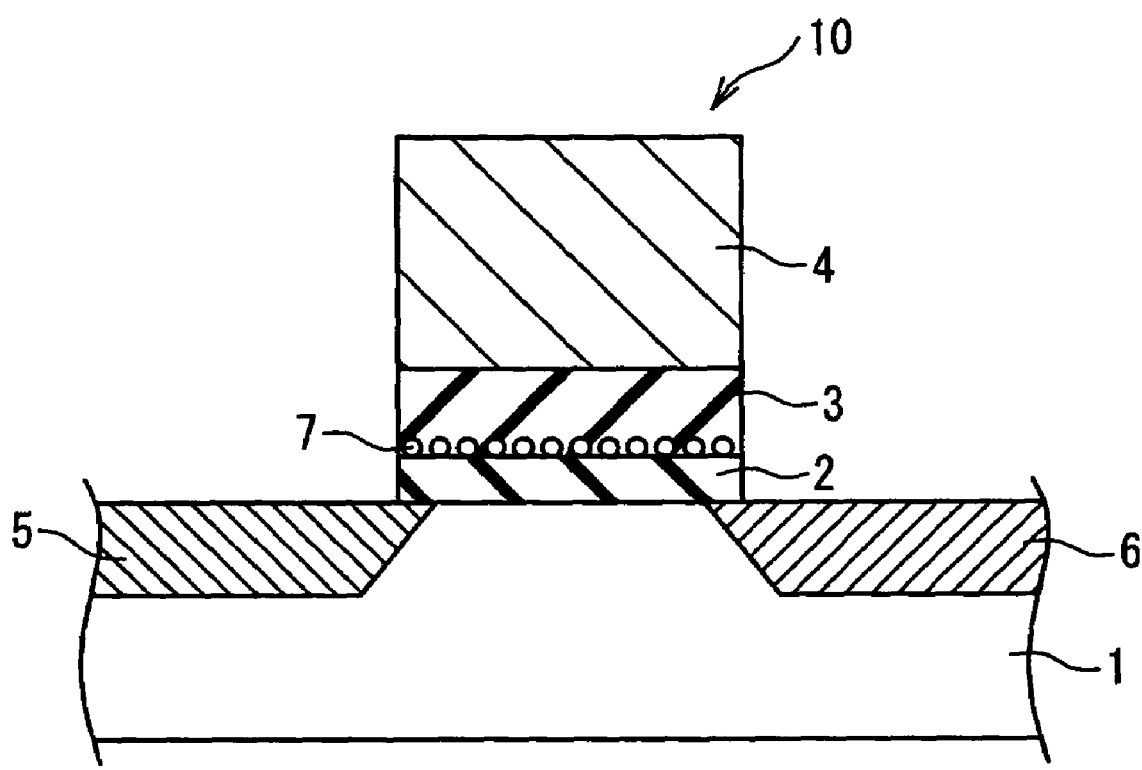
FIG. 3 is a cross-sectional view showing a cell structure of a non-volatile semiconductor memory device according to the present invention.

FIG. 3 is a cross-sectional view showing a cell structure of a non-volatile semiconductor memory device according to the present embodiment. In the non-volatile semiconductor memory device of the present embodiment, a plurality of memory cells are arranged in matrix form. As shown in FIG. 3, in a memory cell 10 of the non-volatile semiconductor memory device according to the present embodiment, a source 5 and a drain 6 are formed in a silicon substrate 1. A channel region is formed between the source 5 and the drain 6. A silicon oxide film 2 having a thickness of 2.0 to 10.0 nm as a first insulating film is formed on the channel region. Also, a plurality of grains 7 (referred to as granular dots, hereinafter) made of silicon are separately formed on the silicon oxide film (first insulating film) 2. The plurality of granular dots 7 serve as a floating gate. A diameter of each granular dot 7 is, for example, 3.0 to 10.0 nm. Also, the granular dot 7 may include boron, phosphor or arsenic.

A second insulating film 3 is formed to cover the silicon oxide film 2 and the granular dots 7. That is to say, the granular dots 7 appear to be formed in the second insulating film 3 and located adjacent to the silicon oxide film 2, as shown in FIG. 3. The second insulating film 3 is a high dielectric constant film (high-k film) made of oxide whose dielectric constant is higher than that of the first insulating film 2 and whose heat of formation is higher than that of the first insulating film (silicon oxide film) 2. The thickness of the high dielectric constant film 3 is, for example, 8.0 to 50.0 nm. Moreover, a control gate 4 made of poly-silicon is formed on the high dielectric constant film 3.

In the memory cell 10 according to the present embodiment, the high dielectric constant film 3 made of the oxide, which has the higher dielectric constant and the higher heat of formation than those of silicon oxide, is formed as the second insulating film between the control gate 4 and the silicon oxide film 2. Thus, the capacity between the granular dots 7 and the control gate 4 is higher as compared with a case where the entire insulating film between the control gate 4 and the channel region is made of silicon oxide. Accordingly, it is possible to increase a voltage applied to the silicon oxide film 2 which is provided between the granular dots 7 and the channel. As a result, even if the voltage applied to the control gate 4 is decreased, the programming and the erasing can be carried out. That is to say, it is possible to reduce the voltage applied to the control gate 4 without decreasing the programming speed and the erasing speeds. Also, even if the thickness of the silicon oxide film 2 is made larger, the programming and the erasing can be carried out with almost the same voltage as in the conventional technique. Thus, it is possible to make the thickness of the silicon oxide film 2 larger than that of the conventional non-volatile semiconductor memory device, and hence to prevent the leakage of the electrons from the granular dots 7 serving as the floating gate.

Moreover, since the high dielectric constant film 3 is made of the oxide whose heat of formation is higher than that of silicon oxide, the high dielectric constant film 3 is excellent in thermal stability (heat stability). Therefore, even when thermal treatment is carried out at a high temperature, the oxide constituting the high dielectric constant film 3 does not react with the granular dots 7 or the silicon included in the control gate 4. It is thus possible to prevent the formation of silicon oxide and metal on boundaries with respect to the granular dots 7 and the control gate 4. According to the present invention, as described above, the thermal treatment at a high temperature can be carried out after the formation of the high dielectric constant film 3. Therefore, the adaptability in a case when the non-volatile semiconductor memory device is combined with a logic integrated circuit is improved. The non-volatile semiconductor device according to the present invention can adopt various processes of manufacturing logic integrated circuits with respect to plural generations.

Figure 1:
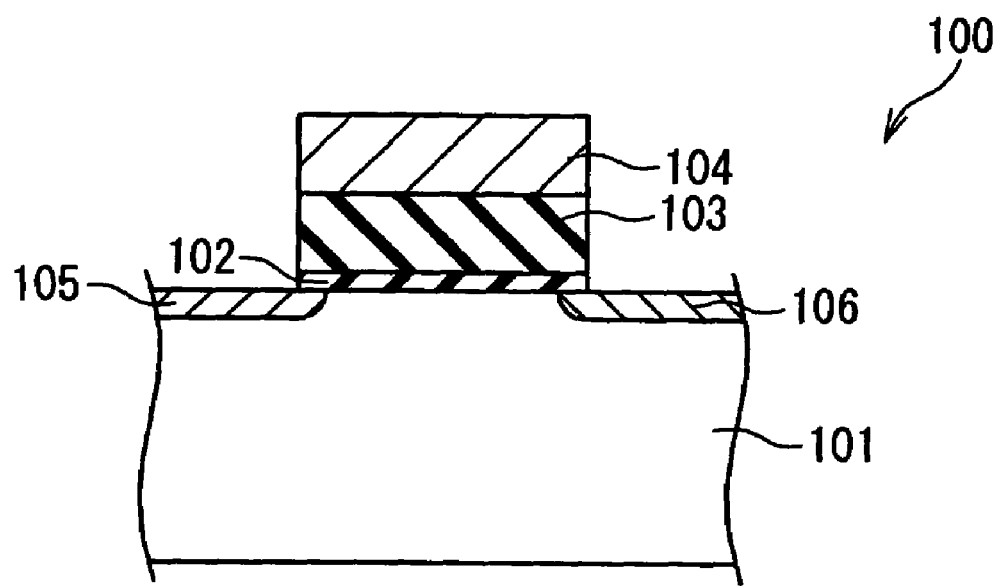
FIG. 1 is a cross-sectional view showing a memory cell of a conventional non-volatile semiconductor memory device.
Figure 2:
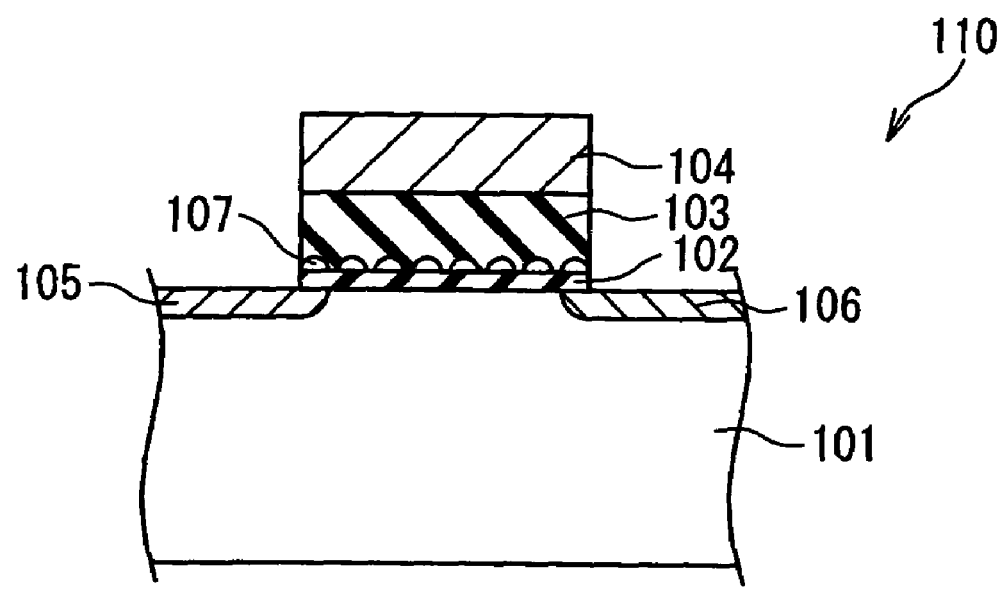
FIG. 2 is a cross-sectional view showing a memory cell of a conventional non-volatile semiconductor memory device which uses a plurality of silicon grains.
Figure 4:
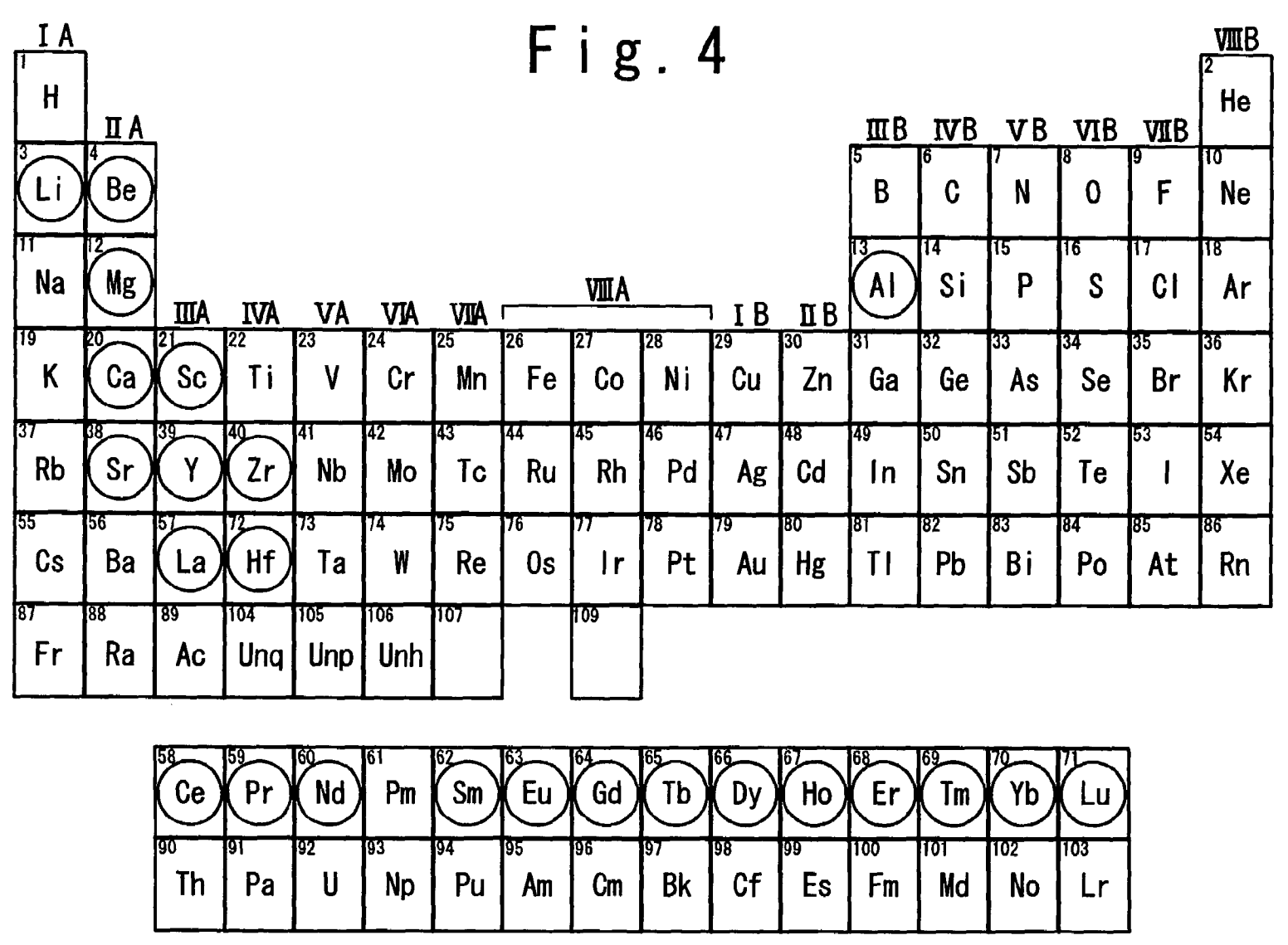

FIG. 4 is a view showing the elements constituting the oxide which is stable with respect to silicon. The oxide constituting the high dielectric constant film 3 preferably includes at least one of elements indicated by circles in FIG. 2. Namely, the oxide preferably includes at least one metal selected from the group consisting of Li, Be, Mg, Al, Ca, Sc, Sr, Y, Zr, La, Hf, Ce, Pr, Nd, Sm, Eu, Gd, Tb, Dy, Ho, Er, Tm, Tb and Lu. It is further preferable that the oxide is selected from the group consisting of $Al_2O_3$, $CeO_2$, $HfO_2$, $La_2O_3$, $MgO$, $Sc_2O_3$ or $ZrO_2$. Since each of these oxides has a higher dielectric constant than that of silicon oxide ($SiO_2$) as shown in the following table 1, it is possible to reduce the voltage applied to the control gate 4 at the times of the programming and the erasing. Also, each oxide has heat of formation which is sufficiently larger than that of silicon oxide, and hence its stability with regard to the high temperature is excellent. Thus, each oxide does not react with silicon, even if the thermal treatment is carried out at a high temperature.

TABLE 1

|  | Heat of formation (kcal/$O_2$) | Dielectric Constant |
| --- | --- | --- |
| $SiO_2$ | −206 | 3.9 |
| $Al_2O_3$ | −250 | 6–13 |
| $CeO_2$ | −258 | 26 |
| $HfO_2$ | −268 | 15–40 |
| $La_2O_3$ | −285 | 20–30 |
| $MgO$ | −288 | 9.6 |
| $Sc_2O_3$ | −274 | 12 |
| $ZrO_2$ | −262 | 25 |

It should be noted that germanium can be preferably used instead of silicon for forming the granular dots 7 or the control gate 4, because germanium oxide has a heat of formation smaller than that of silicon oxide.

Next, a method of manufacturing the memory cell 10 in the non-volatile semiconductor memory device according to the present embodiment will be described below. FIGS. 5A to 13A are cross-sectional views showing the manufacturing method of the memory cell 10 in an order of manufacturing processes. FIGS. 5B to 13B are cross-sectional views along lines A—A shown in FIGS. 5A to 13A, respectively. FIGS. 5C to 13C are cross-sectional views of the peripheral circuit region corresponding to FIGS. 5A to 13A, respectively.

First, as shown in FIGS. 5A to 5C, an STI (Shallow Trench Isolation) film 8 is formed on a silicon substrate 1. Next, the surface of the substrate 1 is cleaned, and a silicon oxide film 2 is formed on the substrate 1, as shown in FIGS. 6A to 6C. The thickness of the silicon oxide film 2 is, for example, 2.0 to 10.0 nm.

Next, as shown in FIGS. 7A to 7C, a large number of granular dots 7 are formed on the entire surface of the silicon oxide film 2. The granular dots 7 are formed to be separated from each other at a predetermined distance. When the granular dots 7 are made of silicon, for example, a CVD (Chemical Vapor Deposition) apparatus is used. In this case, mono-silane gas or dichloro-silane gas is introduced together with nitrogen carrier into a reaction room whose inner temperature is 600 to 700° C. At this time, a pressure of the gas to be introduced is set to be about 0.13 Pa (1 mTorr). By setting the deposition speed of poly-silicon to be extremely low, micro silicon crystal grains are generated on the surface of the silicon oxide film 2. Here, the diameter of each grain is, for example, 3.0 to 10.0 nm.

Next, as shown in FIGS. 8A to 8C, a high dielectric constant film 3 is formed so as to cover the silicon oxide film 2 and the granular dots 7. The thickness of the high dielectric constant film 3 is, for example, 8.0 to 50.0 nm. After that, as shown in FIGS. 9A to 9C, the silicon oxide film 2, the granular dots 7 and the high dielectric constant film 3 in the region where the peripheral circuit (the logic IC) is formed are removed. Then, as shown in FIGS. 10A to 10C, a silicon oxide film 9 serving as a gate insulating film is formed on the substrate 1 in the peripheral circuit region. Next, a poly-silicon film 11 serving as a gate electrode is formed on the whole surface. Accordingly, the poly-silicon film 11 is formed on the high dielectric constant film 3 in the region where the memory cell 10 is formed, as shown in FIGS. 11A and 11B. Also, the poly-silicon film 11 is formed on the silicon oxide film 9 in the peripheral circuit region, as shown in FIG. 11C. After that, as shown in FIGS. 12A and 12B, the poly-silicon film 11, the high dielectric constant film 3 and the granular dots 7 are removed by the etching in the region other than a predetermined region where the control gate 4 is to be formed. Here, even if the granular dots 7 remain without being etched, they have no influence on the property of the memory device. As for the region where the peripheral circuit is formed, the poly-silicon film 11 is removed by the etching in the region other than a predetermined region where the gate is to be formed, as shown in FIG. 12C. Then, as shown in FIGS. 13A to 13C, arsenic is injected into the substrate 1 to form a diffusion layer 12 which serves as the source 5 and the drain 6. After that, the known processes are used to complete the non-volatile semiconductor memory device.

Next, another method of manufacturing the memory cell 10 in the non-volatile semiconductor memory device according to the present embodiment will be described below. FIGS. 14A to 21A are cross-sectional views showing the other manufacturing method of the memory cell 10 in an order of manufacturing processes. FIGS. 14B to 21B are cross-sectional views along lines A—A shown in FIGS. 14A to 21A, respectively. FIGS. 14C to 21C are cross-sectional views of the peripheral circuit region corresponding to FIGS. 14A to 21A, respectively.

First, as shown in FIGS. 14A to 14C, an STI film 8 is formed on a silicon substrate 1. Next, the surface of the substrate 1 is cleaned, and a silicon oxide film 2 is formed on the substrate 1, as shown in FIGS. 15A to 15C. The thickness of the silicon oxide film 2 is, for example, 2.0 to 10.0 nm. Then, as shown in FIGS. 16A to 16C, a large number of granular dots 7 are formed on the entire surface of the silicon oxide film 2 in a similar way as described above. The granular dots 7 are formed to be separated from each other at a predetermined distance. After that, the granular dots 7 in the peripheral circuit region are removed as shown in FIGS. 17A to 17C.

Next, as shown in FIGS. 18A to 18C, a high dielectric constant film 3 is formed on the whole surface. The thickness of the high dielectric constant film 3 is, for example, 8.0 to 50.0 nm. Thus, as shown in FIGS. 18A and 18B, the high dielectric constant film 3 is formed so as to cover the silicon oxide film 2 and the granular dots 7 in the region where the memory cell 10 is formed. Also, as shown in FIG. 18C, the high dielectric constant film 3 serving as a gate insulating film is formed on the substrate 1 in the peripheral circuit region. After that, as shown in FIGS. 19A to 19C, a poly-silicon film 11 serving as a gate electrode is formed on the high dielectric constant film 3. Then, as shown in FIGS. 20A and 20B, the poly-silicon film 11, the high dielectric constant film 3 and the granular dots 7 are removed by the etching in the region other than a predetermined region where the control gate 4 is to be formed. Here, even if the granular dots 7 remain without being etched, they have no influence on the property of the memory device. As for the region where the peripheral circuit is formed, the poly-silicon film 11 and the high dielectric constant film 3 are removed by the etching in the region other than a predetermined region where the gate is to be formed, as shown in FIG. 20C. Then, as shown in FIGS. 21A to 21C, arsenic is injected into the substrate 1 to form a diffusion layer 12 which serves as the source 5 and the drain 6. After that, the known processes are used to complete the non-volatile semiconductor memory device.

As described above, the non-volatile semiconductor memory device according to the present embodiment has excellent adaptability with regard to the method of manufacturing the peripheral circuit (logic IC). For example, when the memory cell 10 is manufactured, the gate insulating film and the gate electrode of the peripheral circuit can be formed at the same time. Also, since the high dielectric constant film 3 is made of the oxide having heat of formation higher than that of the oxide silicon, the high dielectric constant film 3 is hard to react with silicon. Thus, the thermal treatment at the high temperature is possible after the formation of the high dielectric constant film 3. Therefore, the present invention is suitable for an integrated circuit which includes the non-volatile semiconductor memory device and a logic integrated circuit formed on the same substrate 1. Moreover, since the high dielectric constant film 3 is made of the oxide that is hard to react with the silicon, the reaction with silicon included in the substrate 1 can be also suppressed. Thus, when the high dielectric constant film 3 is applied as the gate insulating film of the logic integrated circuit, it is not necessary to provide a barrier layer between the substrate and the gate insulating film. It is therefore possible to reduce the drive voltage of the logic integrated circuit.

An operation of the non-volatile semiconductor memory device according to the present embodiment will be described below. When the programming of the memory cell 10 is performed, for example, the source 5 and the substrate 1 are grounded, and a high voltage is applied to the control gate 4 and the drain 6. Accordingly, electrons move in the channel region at a high speed from the source 5 to the drain 6. Then, the electrons acquiring a high energy in the vicinity of the drain 6 pass through the silicon oxide film 2, and are injected into the granular dots 7 serving as the floating gate. As a result, the floating gate is negatively charged, and a threshold voltage observed from the control gate 4 becomes higher.

On the other hand, when the erasing of the memory cell 10 is carried out, the source 5 is opened, a negative voltage is applied to the control gate 4, and the substrate 1 is grounded. When a positive voltage is applied to the drain 6, hot holes are injected from the substrate 1 to the granular dots 7. The hole and the electron stored in the granular dot 7 are canceled out each other, and hence the potential of the floating gate is returned to neutral. As a result, the threshold voltage observed from the control gate 4 is returned to the state prior to the programming.

In the above-mentioned embodiment, the control gate 4 is made of poly-silicon. However, the present invention is not limited thereto. The control gate 4 can be made of materials including silicon. For example, the control gate 4 may be made of doped poly-silicon such as phosphor doped poly-silicon and the like. Also, the upper portion of the poly-silicon may be made into silicide.

Also, in the non-volatile semiconductor memory device according to the present embodiment, the granular dots 7 are made of silicon. However, the present invention is not limited thereto. For example, the granular dots 7 may be made of germanium, or the granular dots 7 may be made of the mixture of germanium and silicon. The heat of formation of oxide germanium is smaller than the heat of formation of the oxide silicon. Therefore, even if the granular dots 7 are made of germanium or the mixture of germanium and silicon, it is possible to prevent the formation of germanium oxide and metal on the surfaces of the granular dots 7, because the high dielectric constant film 3 is made of the oxide having the heat of formation greater than that of the oxide silicon according to the present invention.

It will be obvious to one skilled in the art that the present invention may be practiced in other embodiments that depart from the above-described specific details. The scope of the present invention, therefore, should be determined by the following claims.

What is claimed is:

1. A non-volatile semiconductor memory device comprising:
    a substrate;
    a first insulating film formed on said substrate;
    a second insulating film formed on said first insulating film;
    a plurality of granular dots formed in said second insulating film adjacent to said first insulating film as a floating gate; and
    a control gate formed on said second insulating film,
    wherein said second insulating film is a high dielectric constant film made of oxide whose dielectric constant is higher than that of said first insulating film and whose heat of formation is higher than that of silicon oxide.

2. The non-volatile semiconductor memory device according to claim 1, wherein said plurality of granular dots are made of at least one material selected from the group consisting of silicon and germanium.

3. The non-volatile semiconductor memory device according to claim 1,
wherein said second insulating film is made of oxide including at least one metal selected from the group consisting of Li, Be, Mg, Al, Ca, Sc, Sr, Y, Zr, La, Hf, Ce, Pr, Nd, Sm, Eu, Gd, Tb, Dy, Ho, Er, Tm, Tb and Lu.

4. The non-volatile semiconductor memory device according to claim 2,
wherein said second insulating film is made of oxide including at least one metal selected from the group consisting of Li, Be, Mg, Al, Ca, Sc, Sr, Y, Zr, La, Hf, Ce, Pr, Nd, Sm, Eu, Gd, Tb, Dy, Ho, Er, Tm, Tb and Lu.

5. The non-volatile semiconductor memory device according to claim 3,
wherein said second insulating film is made of oxide selected from the group consisting of $Al_2O_3$, $CeO_2$, $HfO_2$, $La_2O_3$, MgO, $Sc_2O_3$ and $ZrO_2$.

6. The non-volatile semiconductor memory device according to claim 4,
wherein said second insulating film is made of oxide selected from the group consisting of $Al_2O_3$, $CeO_2$, $HfO_2$, $La_2O_3$, MgO, $Sc_2O_3$ and $ZrO_2$.

7. A semiconductor device comprising:
a substrate;
a non-volatile memory cell formed on said substrate; and
an integrated circuit formed on said substrate,
wherein said non-volatile memory cell includes:
a first insulating film formed on said substrate;
a second insulating film formed on said first insulating film;
a plurality of granular dots formed in said second insulating film adjacent to said first insulating film as a floating gate; and
a control gate formed on said second insulating film,
wherein said second insulating film is a high dielectric constant film made of oxide whose dielectric constant is higher than that of said first insulating film and whose heat of formation is higher than that of silicon oxide, and at least a part of a gate insulating film of a transistor included in said integrated circuit is said high dielectric constant film.

8. The semiconductor device according to claim 7,
wherein said plurality of granular dots are made of at least one material selected from the group consisting of silicon and germanium.

9. The semiconductor device according to claim 7,
wherein said second insulating film is made of oxide including at least one metal selected from the group consisting of Li, Be, Mg, Al, Ca, Sc, Sr, Y, Zr, La, Hf, Ce, Pr, Nd, Sm, Eu, Gd, Tb, Dy, Ho, Er, Tm, Tb and Lu.

10. The semiconductor device according to claim 8,
wherein said second insulating film is made of oxide including at least one metal selected from the group consisting of Li, Be, Mg, Al, Ca, Sc, Sr, Y, Zr, La, Hf, Ce, Pr, Nd, Sm, Eu, Gd, Tb, Dy, Ho, Er, Tm, Tb and Lu.

11. The semiconductor device according to claim 9,
wherein said second insulating film is made of oxide selected from the group consisting of $Al_2O_3$, $CeO_2$, $HfO_2$, $La_2O_3$, MgO, $Sc_2O_3$ and $ZrO_2$.

12. The semiconductor device according to claim 10,
wherein said second insulating film is made of oxide selected from the group consisting of $Al_2O_3$, $CeO_2$, $HfO_2$, $La_2O_3$, MgO, $Sc_2O_3$ and $ZrO_2$.

* * * * *